US012567566B2

(12) United States Patent
Chou et al.

(10) Patent No.: US 12,567,566 B2
(45) Date of Patent: Mar. 3, 2026

(54) WIDE-COVERAGE EDGE RING FOR ENHANCED SHIELDING IN SUBSTRATE PROCESSING SYSTEMS

(71) Applicant: LAM RESEARCH CORPORATION, Fremont, CA (US)

(72) Inventors: Shang-I Chou, San Jose, CA (US); Dandan Wang, San Jose, CA (US); Giovanni Paolo Gajudo, Brentwood, CA (US); Gary Gragg, San Jose, CA (US); Robert G. O'Neill, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 60 days.

(21) Appl. No.: 18/711,966

(22) PCT Filed: Feb. 7, 2022

(86) PCT No.: PCT/US2022/015396
§ 371 (c)(1),
(2) Date: May 21, 2024

(87) PCT Pub. No.: WO2023/101709
PCT Pub. Date: Jun. 8, 2023

(65) Prior Publication Data
US 2025/0022691 A1 Jan. 16, 2025

Related U.S. Application Data

(60) Provisional application No. 63/285,772, filed on Dec. 3, 2021.

(51) Int. Cl.
*H01J 37/32* (2006.01)
*H01L 21/687* (2006.01)

(52) U.S. Cl.
CPC .. *H01J 37/32642* (2013.01); *H01J 37/32715* (2013.01); *H01J 37/32807* (2013.01);
(Continued)

(58) Field of Classification Search
CPC ........... H01J 37/32642; H01J 37/32715; H01J 37/32807; H01J 2237/3321;
(Continued)

(56) References Cited

U.S. PATENT DOCUMENTS

| | | | |
|---|---|---|---|
| 7,879,250 B2 | 2/2011 | Katz et al. | |
| 8,440,049 B2 | 5/2013 | Zhou et al. | |

(Continued)

FOREIGN PATENT DOCUMENTS

| | | | | | |
|---|---|---|---|---|---|
| CN | 113725059 B | * | 4/2025 | ................ | H01J 9/18 |
| KR | 100578129 B1 | | 5/2006 | | |

(Continued)

OTHER PUBLICATIONS

Taiwanese Office Action from Corresponding Taiwanese Patent Application No. 112301622 dated Jan. 16, 2024.
(Continued)

*Primary Examiner* — Adam D Houston

(57) ABSTRACT

A wide-coverage edge ring configured to be arranged above a bottom ring in a substrate processing chamber includes an upper surface, a lower surface that includes a lower surface step that extends downward from the lower surface and is configured to be received within and interface with a pocket defined at least partially by an upper surface of the bottom ring and an inner surface of a chamber liner, an inner diameter, a ledge defined in the inner diameter of the edge ring, and an outer diameter. The outer diameter of the edge ring includes a projection that extends radially outward from the edge ring and defines an inward step in the outer diameter, the projection and the inward step are configured
(Continued)

to interface with an upper end of the chamber liner, and the projection is configured to extend at least partially over the upper end of the chamber liner.

21 Claims, 7 Drawing Sheets

(52) U.S. Cl.
CPC .. *H01L 21/68757* (2013.01); *H01L 21/68785* (2013.01); *H01J 2237/3321* (2013.01); *H01J 2237/3341* (2013.01)

(58) Field of Classification Search
CPC ....... H01J 2237/3341; H01L 21/68757; H01L 21/68785
See application file for complete search history.

(56) References Cited

U.S. PATENT DOCUMENTS

| | | | | |
|---|---|---|---|---|
| 10,119,192 | B2 * | 11/2018 | Aboagye | C23C 16/4584 |
| 10,658,222 | B2 | 5/2020 | Yan et al. | |
| 11,211,282 | B2 * | 12/2021 | Chang | H01J 37/32715 |
| D1,059,312 | S * | 1/2025 | Chowdhury | D13/182 |
| 12,261,028 | B2 * | 3/2025 | Takahashi | H01J 37/32642 |
| D1,069,863 | S * | 4/2025 | Chowdhury | D15/138 |
| 12,293,902 | B2 * | 5/2025 | Mustafa | H01J 37/32715 |
| 12,400,902 | B2 * | 8/2025 | Janicki | H01L 21/68785 |
| 2005/0061447 | A1 | 3/2005 | Kim et al. | |
| 2016/0099162 | A1 | 4/2016 | Ng et al. | |
| 2016/0307742 | A1 * | 10/2016 | Mishra | H01J 37/32642 |
| 2019/0229007 | A1 * | 7/2019 | Mustafa | H01L 21/68757 |
| 2019/0385891 | A1 * | 12/2019 | Chang | H01L 21/68757 |
| 2020/0020565 | A1 | 1/2020 | Rathnasinghe et al. | |
| 2020/0066495 | A1 | 2/2020 | Noorbakhsh et al. | |
| 2020/0234928 | A1 * | 7/2020 | Vishwanath | H01L 21/68742 |
| 2020/0312633 | A1 | 10/2020 | Rathnasinghe et al. | |
| 2020/0388472 | A1 | 12/2020 | Takayama et al. | |
| 2021/0319987 | A1 * | 10/2021 | Chiba | C23C 16/4586 |
| 2022/0165551 | A1 * | 5/2022 | Pei | H01J 37/32642 |
| 2023/0178417 | A1 * | 6/2023 | Matsuura | H01L 21/683 |
| | | | | 414/680 |
| 2025/0022691 | A1 * | 1/2025 | Chou | H01J 37/32642 |
| 2025/0087525 | A1 * | 3/2025 | Tsutsue | H01L 21/68735 |

FOREIGN PATENT DOCUMENTS

| | | | | | |
|---|---|---|---|---|---|
| KR | 20150073123 | A | 6/2015 | | |
| KR | 20200031181 | A | 3/2020 | | |
| KR | 20220021501 | A | 2/2022 | | |
| KR | 20220167830 | A | 12/2022 | | |
| TW | D176077 | S | 6/2016 | | |
| TW | 202121486 | A | 6/2021 | | |
| TW | M639962 | U | 4/2023 | | |
| WO | WO-2025052582 | A1 * | 3/2025 | ......... | C23C 16/4585 |

OTHER PUBLICATIONS

Taiwanese Office Action from Corresponding Taiwanese Patent Application No. 111104367 dated Jun. 10, 2025.
Korean Office Action from Corresponding KR App. No. 10-2024-7021483 dated Jun. 29, 2025.
International Search Report and Written Opinion of the ISA issued in PCT/US2022/015396, mailed Aug. 29, 2022; ISA/KR.
Extended European Search Report received for related EP App. No. 22901964 dated Oct. 21, 2025.

* cited by examiner

WIDE-COVERAGE EDGE RING FOR ENHANCED SHIELDING IN SUBSTRATE PROCESSING SYSTEMS

CROSS-REFERENCE TO RELATED APPLICATIONS

This application is a U.S. National Phase Application under 35 U.S.C. 371 of International Application No. PCT/US2022/015396, filed on Feb. 7, 2022, which claims the benefit of U.S. Provisional Application No. 63/285,772, filed on Dec. 3, 2021. The entire disclosures of the applications referenced above are incorporated herein by reference.

FIELD

The present disclosure relates to wide-coverage edge ring designs for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems perform treatments on substrates such as semiconductor wafers. Examples of substrate treatments include deposition, ashing, etching, cleaning and/or other processes. Process gas mixtures may be supplied to the processing chamber to treat the substrate. Plasma may be used to ignite the gases to enhance chemical reactions.

A substrate is arranged on a substrate support during treatment. An edge ring has an annular body that is arranged around and adjacent to a radially outer edge of the substrate. The edge ring may be used to shape or focus the plasma onto the substrate. The edge ring is sometimes referred to as a top edge ring. Existing machine-replaceable top edge rings are not designed for wide coverage partly because the rings' outer diameter needs to be small enough to pass through multiple transfer ports within a substrate processing system. Examples of such edge rings can be found in U.S. Pat. No. 10,658,222, issued on May 19, 2020, and U.S. Patent Pub. No. 2020/0020565, published on Jan. 16, 2020. These examples and other existing machine-replaceable top edge rings, when installed, cover areas immediately adjacent to the substrate. In some instances, an edge ring may partially cover a bottom ring. However, these rings are not designed to provide sufficient protection to underlying components (e.g., bottom edge rings or other support or actuation structures) from ion bombardment during an etching process. Energized plasma ion may quickly erode the outer edge of the underlying components when they are not shielded by the top edge ring. This often leads to the need to replace the underlying components more frequently.

SUMMARY

A wide-coverage edge ring configured to be arranged above a bottom ring in a substrate processing chamber includes an upper surface, a lower surface that includes a lower surface step that extends downward from the lower surface and is configured to be received within and interface with a pocket defined at least partially by an upper surface of the bottom ring and an inner surface of a chamber liner, an inner diameter, a ledge defined in the inner diameter of the edge ring, and an outer diameter. The outer diameter of the edge ring includes a projection that extends radially outward from the edge ring and defines an inward step in the outer diameter, the projection and the inward step are configured to interface with an upper end of the chamber liner, and the projection is configured to extend at least partially over the upper end of the chamber liner.

In other features, the edge ring is a replaceable edge ring configured to be transferred into and out of the substrate processing chamber through a same opening as a substrate. The edge ring is comprised of quartz. The upper surface of the edge ring is generally flat. The upper surface of the edge ring includes an angled upward step. A lower, inner corner of the edge ring has a first radius and a lower, outer corner of the edge ring has a second radius. The second radius is greater than the first radius. A thickness of the projection is greater than or equal to a thickness of the ledge.

In other features, an edge ring system includes the edge ring and further includes the bottom ring. The bottom ring is comprised of ceramic. The bottom ring includes a plurality of guide channels. An inner diameter of the bottom ring includes a rim extending upward toward the edge ring, and wherein the pocket is defined between the rim and the chamber liner. The edge ring system further includes the chamber liner, the upper end of the chamber liner includes an outward step, and the pocket is defined between the rim and the outward step. A radius of a lower, outer corner of the edge ring is configured to interface with a radius defined by the outward step of the chamber liner. A serpentine path is defined between the edge ring and the chamber liner.

An edge ring system includes a bottom ring having a rim that protrudes upward from an inner diameter of the bottom ring and a wide-coverage edge ring arranged on top of the bottom ring. The edge ring includes an upper surface, a lower surface that includes a lower surface step that extends downward from the lower surface radially outward of the rim and is configured to be received within and interface with a pocket defined at least partially by an upper surface of the bottom ring and an inner surface of a chamber liner, an inner diameter, a ledge defined in the inner diameter of the edge ring, and an outer diameter. The outer diameter of the edge ring includes a projection that extends radially outward from the edge ring and defines an inward step in the outer diameter, the projection and the inward step are configured to interface with an upper end of the chamber liner, and the projection is configured to extend at least partially above the upper end of the chamber liner.

In other features, the edge ring is comprised of quartz and the bottom ring is comprised of ceramic. A lower, inner corner of the edge ring has a first radius, a lower, outer corner of the edge ring has a second radius, and the second radius is greater than the first radius. The edge ring system further includes the chamber liner. The upper end of the chamber liner includes an outward step, the pocket is defined between the rim and the outward step, and the second radius of the lower, outer corner of the edge ring is configured to interface with a third radius defined by the outward step of the chamber liner. A serpentine path is defined between the edge ring and the chamber liner.

An edge ring system includes a bottom ring and a wide-coverage edge ring arranged on top of the bottom ring. The edge ring includes an upper surface, a lower surface configured to be supported within and interface with a pocket defined at least partially by an upper surface of the bottom ring and an inner surface of a chamber liner, an inner diameter, a ledge defined in the inner diameter of the edge ring, and an outer diameter. The outer diameter of the edge ring includes a projection that extends radially outward from the edge ring and defines an inward step in the outer diameter, the projection and the inward step are configured to interface with an upper end of the chamber liner, and the projection is configured to extend at least partially above the upper end of the chamber liner.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

During substrate processing, a substrate is arranged on a pedestal such as an electrostatic chuck (ESC), process gases are supplied, and plasma is struck in the processing chamber. Exposed surfaces of components within the processing chamber experience wear due to exposure to the plasma.

For example, an edge ring is arranged around a radially outer edge of the substrate to shape the plasma. During operation, the substrate and an exposed surface of the edge ring are etched by the plasma. As a result, the edge ring wears and the effect of the edge ring on the plasma changes, which may adversely affect uniformity. For example, due to wear, the exposed surface of the edge ring may have a different height relative to the substrate. Therefore, in some substrate processing systems, the processing chamber needs to be opened periodically to replace the worn edge ring.

In some instances, the edge ring may be supported on a bottom ring (e.g., a ceramic bottom ring). In some embodiments, the edge ring is configured to be transferred into and out of the processing chamber through a same opening (e.g., a slot valve) as substrates. This approach reduces chamber down time by eliminating vacuum break and potential sources of contamination. In some examples, since the edge ring needs to fit through multiple transfer openings, an outer diameter of the edge ring is limited by the size of the smallest opening. Hence, the edge ring may not completely cover an upper surface of the bottom ring when installed in the process chamber. Portions of the bottom ring that are not covered by the edge ring or a chamber liner are therefore exposed to plasma and wear, ion bombardment, byproduct deposition, corrosion, etc. Accordingly, exposure of the bottom ring decreases a mean time between cleaning (MTBC) and increases a frequency of chamber shutdown/standby events.

Edge ring designs according to the present disclosure are configured to cover and protect components underneath such as bottom rings and/or other support/actuation systems. For example, the edge ring (e.g., a replaceable quartz edge ring) extends from an inner diameter of the bottom ring past an outer diameter of the bottom ring. In an embodiment, an outer diameter of the edge ring extends to and interfaces with the chamber liner. Accordingly, an upper surface of the bottom ring, including its radially outer most edge, is not exposed to erosion, particles, and/or other contamination within a plasma volume of the processing chamber. Further, gaps between the edge ring and the chamber liner are minimized to prevent plasma light-up and byproduct formation (e.g., aluminum fluoride formation) on the bottom ring.

In an embodiment, a surface profile of the edge ring is configured to interface or interlock with (e.g., is complementary to) surfaces of the chamber liner and/or the bottom ring. In this manner, direct line-of-sight from the plasma volume to the bottom ring and an edge seal of the ESC is eliminated.

Figure 1:
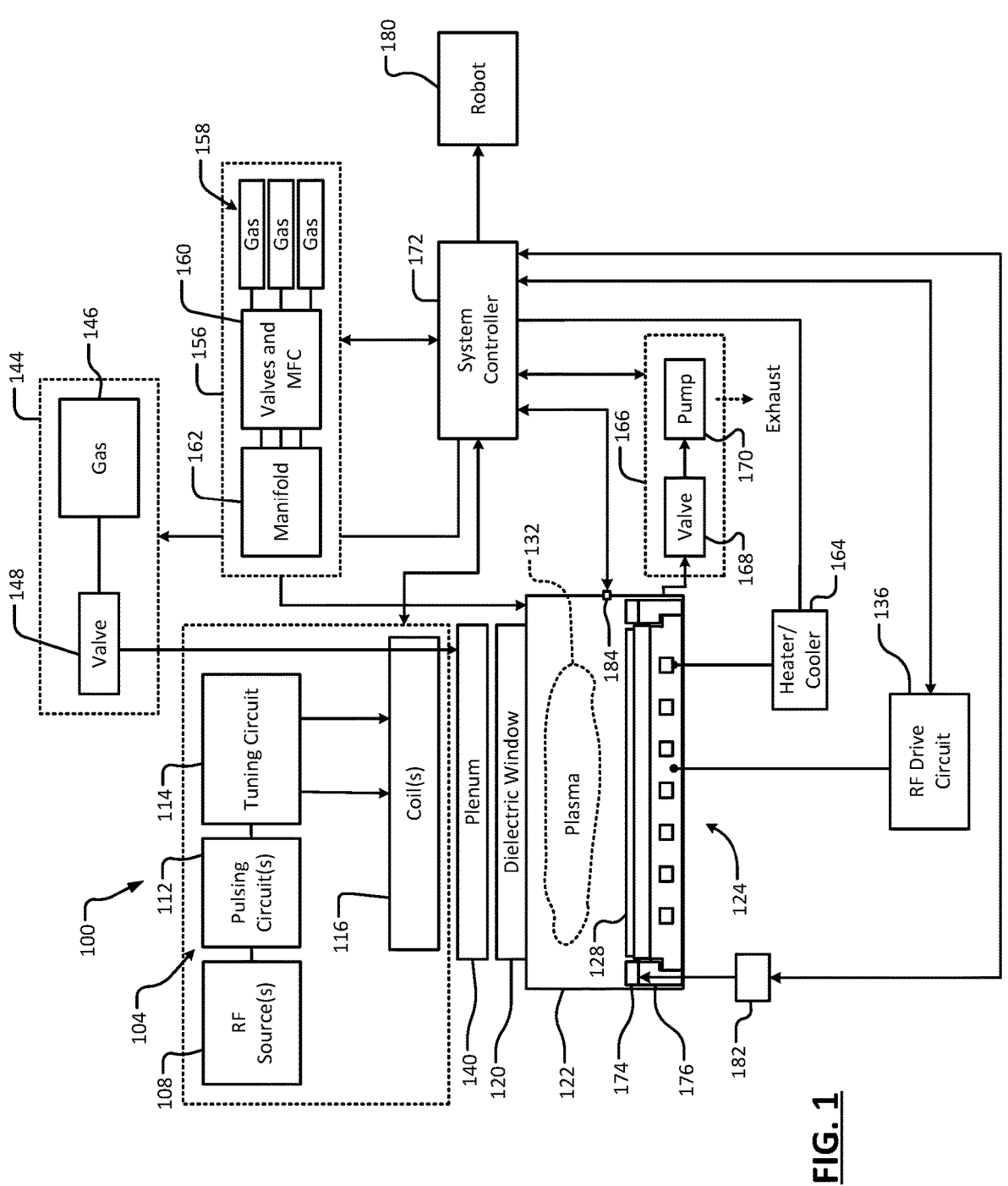
FIG. 1 is a functional block diagram of an example substrate processing system according to the present disclosure.

Referring now to FIG. 1, an example of a substrate processing system 100 that performs plasma processing and that includes a replaceable edge ring system according to certain embodiments of the present disclosure is shown. The substrate processing system 100 includes a coil driving circuit 104. In some examples, the coil driving circuit 104 includes an RF source 108, a pulsing circuit 112, and a tuning circuit 114. The pulsing circuit 112 controls a TCP envelope of the RF signal and varies a duty cycle of the TCP envelope (e.g., between 1% and 99%) during operation. As can be appreciated, the pulsing circuit 112 and the RF source 108 can be combined or separate.

The tuning circuit 114 may be directly connected to one or more inductive coils 116. The tuning circuit 114 tunes an output of the RF source 108 to a desired frequency and/or a desired phase, matches an impedance of the coils 116 and/or splits power between the coils 116. While examples including multiple coils are shown, a single coil including a single conductor or multiple conductors can be used.

A dielectric window 120 is arranged along one side of a processing chamber 122. The processing chamber 122 further comprises a substrate support (or pedestal) 124 to support a substrate 128. The substrate support 124 may include an electrostatic chuck (ESC), a mechanical chuck or other type of chuck. Process gas is supplied to the processing chamber 122 and plasma 132 is generated inside of the processing chamber 122. An RF bias drive circuit 136 may be used to supply an RF bias to the substrate support 124 during operation to control ion energy. The RF bias drive circuit 136 may include an RF source and an impedance matching circuit (not shown).

In some embodiments, a plenum 140 is arranged adjacent to (e.g., above, as shown) the dielectric window 120. A gas delivery system 144 may be used to deliver gas from a gas source 146 via a valve 148 to the plenum 140. The gas may include cooling gas (air) that is used to cool the coils 116 and the dielectric window 120.

A gas delivery system 156 may be used to supply a process gas mixture to the processing chamber 122. The gas delivery system 156 may include gas sources 158 (e.g. precursor, vapor, one or more other gases, inert gases), a gas metering system 160 such as valves and mass flow controllers, and a manifold 162. A gas injector (not shown) may be arranged at a center of the dielectric window 120 (or other location) and is used to inject gas mixtures from the gas delivery system 156 into the processing chamber 122.

A heater/cooler 164 may be used to heat/cool the substrate support 124 to a predetermined temperature. An exhaust system 166 includes a valve 168 and pump 170 to control pressure in the processing chamber 122 and/or to remove reactants from the processing chamber 122 by purging or evacuation.

A system controller 172 may be used to control the process. The system controller 172 monitors system parameters and controls delivery of the gas mixtures, striking, maintaining and extinguishing the plasma, removal of reactants, supply of cooling gas, etc.

The substrate support 124 may include an edge ring system including an edge ring 174. As shown, the edge ring 174 is arranged above a bottom ring 176. The edge ring 174 according to the present disclosure is configured to protect the bottom ring 176 from exposure to the plasma processing environment as described below in more detail. For example, the edge ring 174 extends from an inner diameter of the bottom ring 176 past an outer diameter of the bottom ring 176. In an embodiment, an outer diameter of the edge ring 174 extends to and interfaces with a chamber liner (not shown in FIG. 1).

In certain embodiments, the system controller 172 controls a robot 180 to deliver substrates and/or edge rings to the processing chamber. The system controller 172 also controls one or more actuators 182 that move lift pins (not shown in FIG. 1) to selectively raise and lower the edge ring 174 to facilitate transfer of the edge ring 174 to and from the substrate support 124. The system controller 172 may also receive outputs from one or more sensors 184 that are used to sense a height of the edge rings. Non-limiting examples of sensors include optical sensors, physical sensors, piezo sensors, ultrasonic sensors, etc.

Referring now to FIGS. 2A-2F, an embodiment of an edge ring system 200 for a substrate support 204 according to the present disclosure is shown. For example, the edge ring system 200 is configured for operation within the substrate processing system 100 and the processing chamber 122 as described above in FIG. 1. The edge ring system 200 includes a wide-coverage edge ring 208 (e.g., a top edge ring) arranged to surround a top portion of the substrate support 204. A bottom ring 212 surrounds a baseplate 216 (e.g., a conductive baseplate comprised of aluminum) of the substrate support 204 and the wide-coverage edge ring 208 is arranged above the bottom ring 212. In some embodiments, the wide-coverage edge ring 208 is comprised of quartz and the bottom ring 212 is comprised of ceramic. In some embodiments, the bottom ring 212 is at least partially made of ceramic to minimize erosion caused by exposure to radicals and extends MTBC.

A ceramic layer 220 is arranged on the baseplate 216. The ceramic layer 220 is configured to support a substrate 224 during processing. In some embodiments (as shown), the wide-coverage edge ring 208 is supported on the ceramic layer 220 and does not contact the bottom ring 212. For example, 10-40% of a lower or bottom surface of the bottom ring directly contacts and is supported on the ceramic layer 220. In some embodiments, an adhesive layer 228 is arranged between the baseplate 216 and the ceramic layer 220. An edge seal 232 (e.g., an O-ring) is provided to protect the adhesive layer 228.

In some embodiments, a chamber liner 236 is arranged in a lower portion of a processing chamber 122. In some embodiments, the chamber liner 236 is positioned between an outer wall of the processing chamber 122 and the bottom ring 212. As shown in FIG. 2B, the chamber liner 236 surrounds an outer perimeter of the bottom ring 212 and at least a portion of the wide-coverage edge ring 208. In some embodiments, the chamber liner 236 is provided to minimize byproduct deposition on walls of the processing chamber 122. In some embodiments, the chamber liner 236 is provided to protect the bottom ring 212 from wear, byproduct deposition, etc.

Figure 2A:
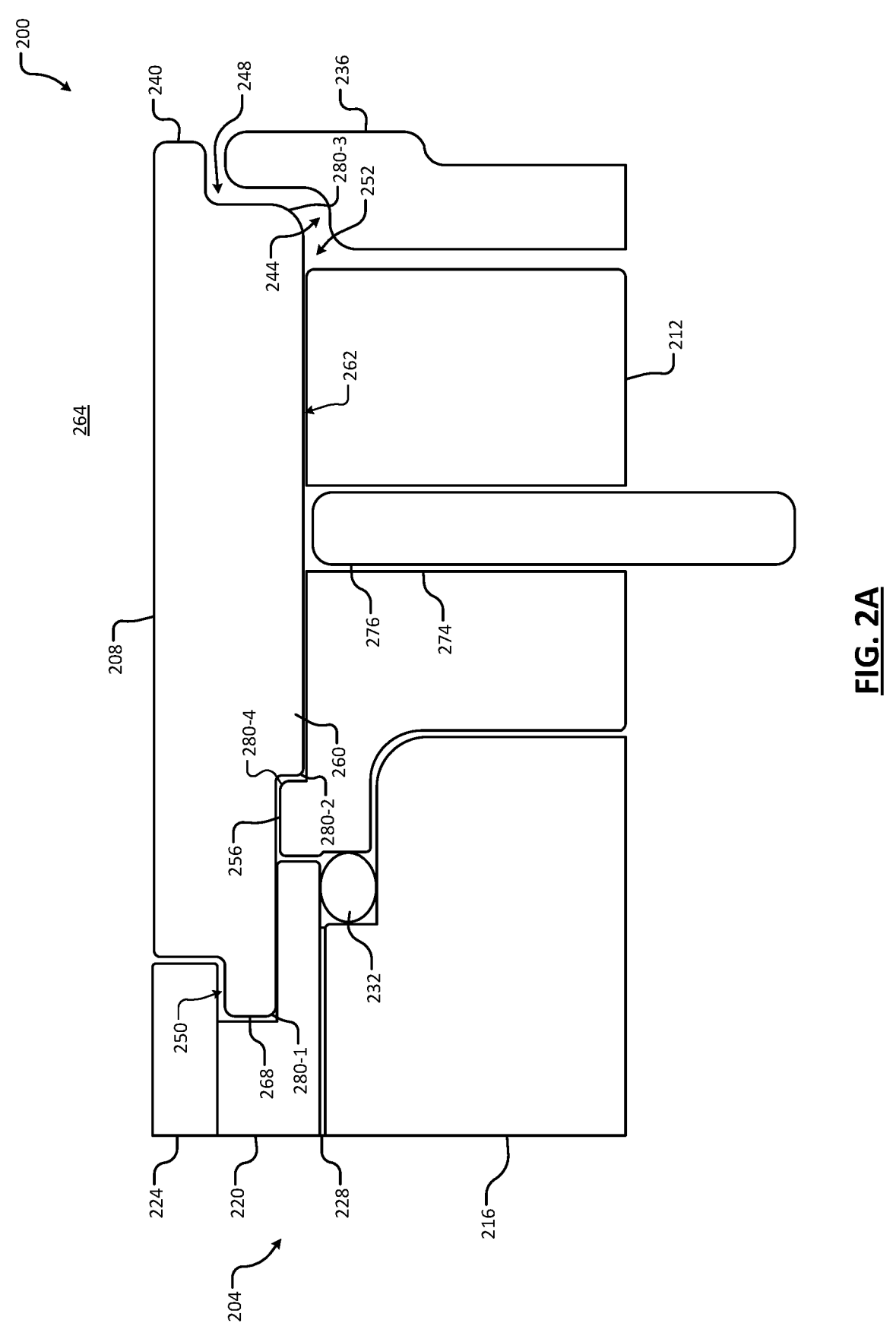
FIG. 2A is an example edge ring according to the present disclosure.
Figure 2B:
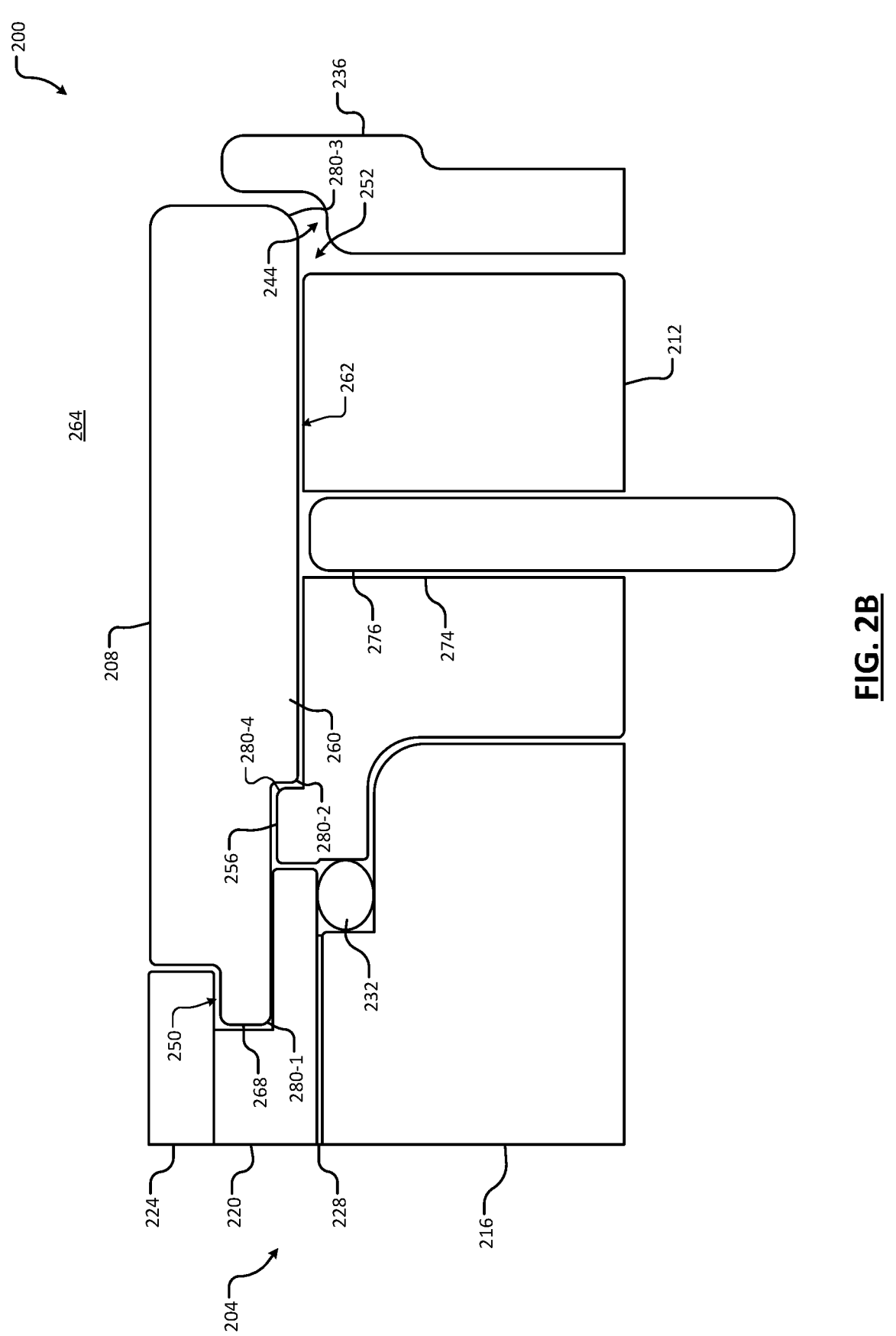
FIG. 2B is another example edge ring according to the present disclosure.

As shown in FIG. 2A, the wide-coverage edge ring 208 includes a lip or projection 240 that extends radially outward from an outer diameter of the wide-coverage edge ring 208 and overhangs/extends above the chamber liner 236. In an embodiment shown in FIG. 2A, an upper end of the chamber liner 236 includes an outward step 244 (i.e., steps radially outward and upward relative to the substrate support 204). Conversely, the outer diameter of the wide-coverage edge ring 208 has an inward step 248 (i.e., steps radially inward and downward relative to the substrate support 204). Accordingly, a profile of the outer diameter of the wide-coverage edge ring 208 is complementary to and configured to interface with the upper end of the chamber liner 236. As shown, the wide-coverage edge ring 208 does not contact the chamber liner 236.

Figure 2C:
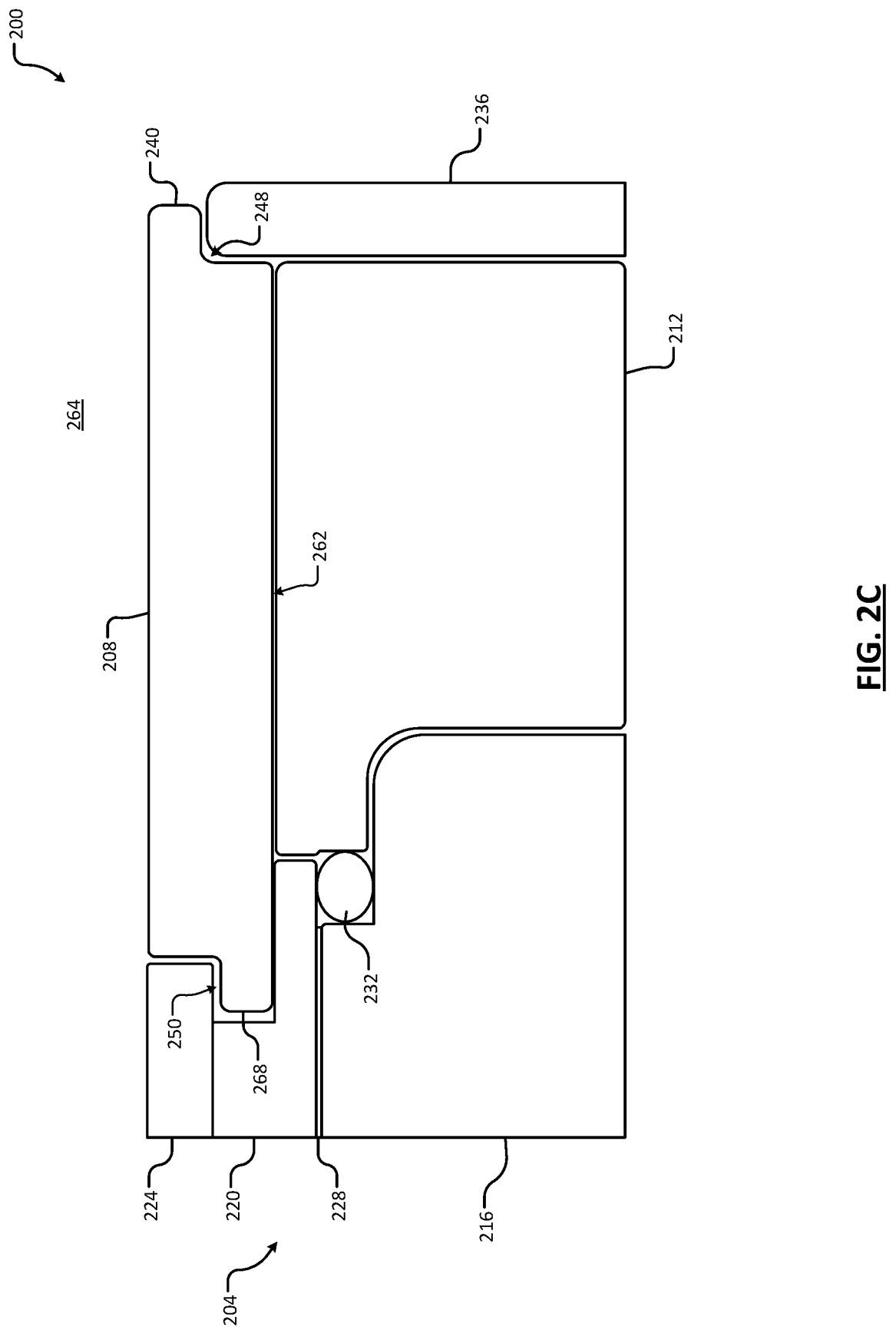
FIG. 2C is another example edge ring according to the present disclosure.
Figure 2D:
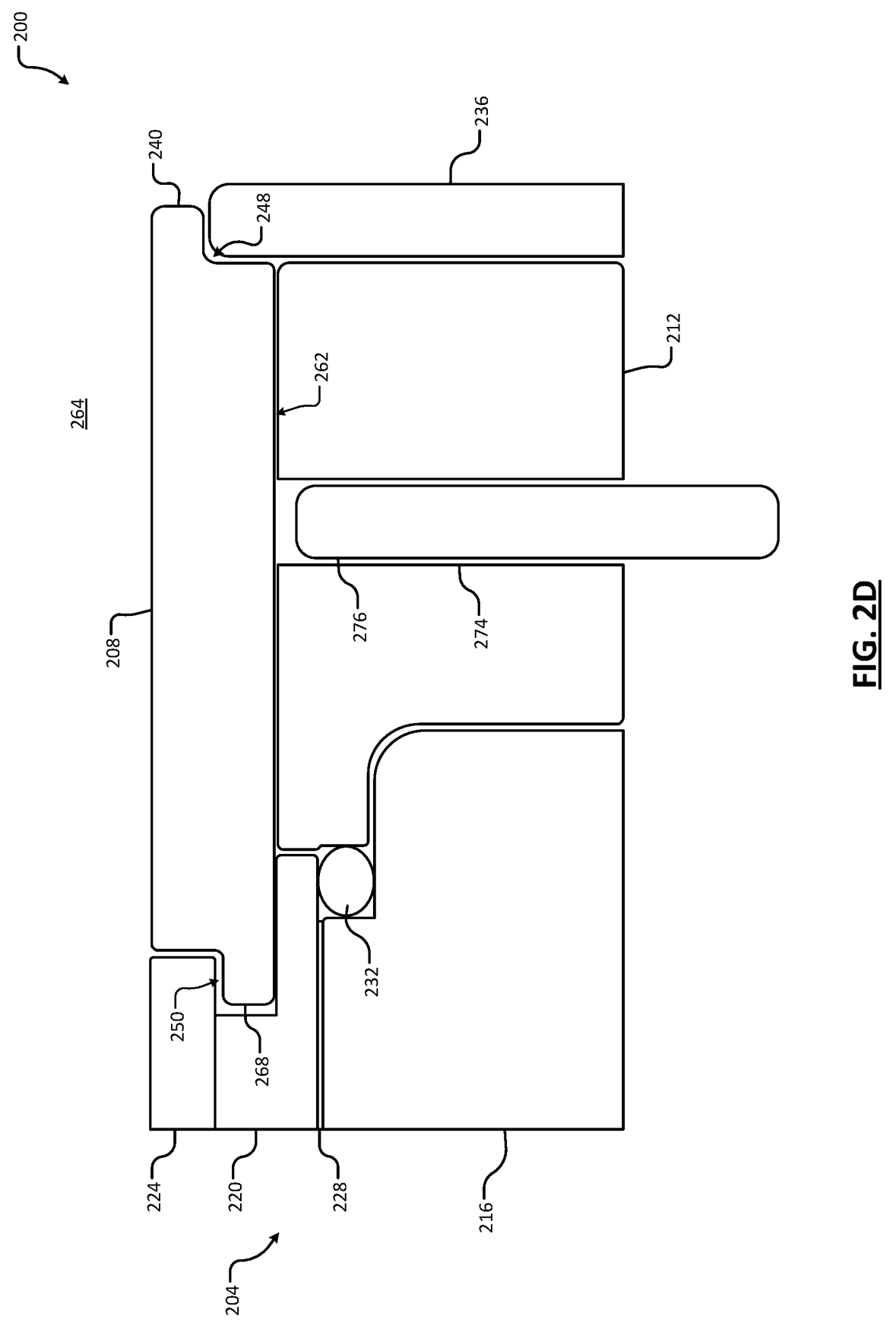
FIG. 2D is another example edge ring according to the present disclosure.

While the chamber liner 236 of FIGS. 2C and 2D does not include the outward step 244, the wide-coverage edge ring 208 of FIGS. 2C and 2D includes the inward step 248 and is configured to interface with the upper end of the chamber liner 236. For example, the projection 240 extends above and covers at least 20% of the upper end of the chamber liner 236. In some embodiments (as shown), the projection covers at least 50% (e.g., between 50% and 100%) of the upper end of the chamber liner 236.

In each of FIGS. 2A, 2B, 2C, and 2D, an inner diameter of the wide-coverage edge ring 208 includes a ledge or step 250. For example, the step 250 extends radially inward and downward from an inner diameter of the wide-coverage edge ring 208. The step 250 is configured to extend below an outer edge of the substrate 224. For example, the substrate 224 extends over and overhangs the step 250.

As shown in FIGS. 2A and 2B, the bottom ring 212 and the chamber liner 236 define a pocket 252. For example, an inner diameter of the bottom ring 212 has an upward-protruding rim 256 and the pocket 252 is defined between the rim 256 and the chamber liner 236. A bottom surface of the wide-coverage edge ring 208 includes a lower surface step 260 that extends downward into the pocket 252 (i.e., radially outward of the rim 256). Conversely, in the embodiment shown in FIGS. 2C and 2D, the bottom surface of the wide-coverage edge ring 208 is generally flat (i.e., does not include a downward step). In this manner, an interface 262 between the wide-coverage edge ring 208, the bottom ring 212, and the chamber liner 236 defines a serpentine or torturous path between a processing chamber volume 264 and the bottom ring 212, edge seal 232, etc. In other words, the interface 262 is configured to eliminate a direct line-of-sight from the processing chamber volume 264 to surfaces of the bottom ring 212. Accordingly, the arrangement of the wide-coverage edge ring 208 and the chamber liner 236 is configured to protect the bottom ring 212 from direct line-of-sight exposure to plasma and ion bombardment.

A radial distance between the inner diameter of the wide-coverage edge ring 208 and the lower surface step 260 may be selected in accordance with a desired minimum surface area on the bottom surface of the lower surface step 260. For example, the bottom surface of the lower surface step 260 may be configured to be supported on an end effector of a transfer robot, such as a transfer robot of a vacuum transfer module. Accordingly, a width of the lower surface step 260 is selected to maximize contact between the bottom surface of the lower surface step 260 and the end effector. In some examples, a maximum radial distance between the inner diameter of the wide-coverage edge ring 208 and the lower surface step 260 is between about 30 and 50 mm. In some embodiments, the maximum radial distance between the inner diameter of the wide-coverage edge ring 208 and the lower surface step 260 is about 40 mm. In an embodiment, an inner edge of the lower surface step 260 is located at a radial distance of the wide-coverage edge ring 208 of no greater than 330 mm. As used herein, the term "about" may refer to "within 5% of."

The interface 262 comprises a gap between bottom surfaces of the wide-coverage edge ring 208 and surfaces of the bottom ring 212 and chamber liner 236. As described above, the edge ring system 200 is configured such that the wide-coverage edge ring 208 is supported on the ceramic layer 220. Accordingly, the bottom surfaces of the wide-coverage edge ring 208 are above and spaced slightly apart from surfaces of the bottom ring 212 and the chamber liner 236. In this manner, manufacturing variances (e.g., variances in thicknesses/heights of the wide-coverage edge ring 208, the bottom ring 212, the ceramic layer 220 etc.) do not result in contact between the wide-coverage edge ring 208 and either of the bottom ring 212 and the chamber liner 236. Instead, manufacturing tolerances of various components of the edge ring system 200 are selected to ensure that the interface 262 includes at least a minimal gap (e.g., a gap of at least 0.03 mm and no greater than 1.20 mm). A width of the gap may be uniform or may vary (e.g., a width of the gap between the wide-coverage edge ring 208 and the bottom ring and a width between the wide-coverage edge ring 208 and the chamber liner 236 may be the same or, as shown, different).

That gap prevents direct contact between the wide-coverage edge ring 208 and the chamber liner 236. In some embodiments, there is no contact between the wide-coverage edge ring 208 and the chamber liner 236. Contact with the chamber liner 236 may change an impedance of the wide-coverage edge ring 208, alter a plasma sheathe above the wide-coverage edge ring 208, etc. Contact with the chamber liner 236 may also cause inadvertent movement of the wide-coverage edge ring 208 during operation (e.g., due to different temperatures of the chamber liner 236 and the wide-coverage edge ring 208, different coefficients of thermal expansion, etc.).

In this manner, exposure of the bottom ring 212 to plasma, ions, radicals, etc. is significantly reduced, which reduces generation of particles, minimizes erosion and wear of the bottom ring 212, and increases MTBC. Further, the wide-coverage edge ring 208 may be consumable and replaceable. In other words, as the wide-coverage edge ring 208 wears during use, the wide-coverage edge ring 208 can be replaced (e.g., in accordance with a predetermined schedule, in response to measured or sensed dimensions of the wide-coverage edge ring 208 reaching a threshold, etc.). Accordingly, since the wide-coverage edge ring 208 is replaceable, the wide-coverage edge ring 208 can be configured to protect the bottom ring 212 without affecting (i.e., decreasing) MTBC.

In some embodiments, a height or thickness of the projection 240 is greater than or equal to a height or thickness of a radially-inward extending ledge 268. Typically, a lifetime (i.e., a time between replacement) of the wide-coverage edge ring 208 is dependent upon the thickness of the ledge 268 since the ledge 268 is exposed to plasma and associated wear. Accordingly, in some embodiments, the projection 240 is at least as thick as the ledge 268 such that the projection 240 does not further limit the lifetime of the wide-coverage edge ring 208. In some embodiments, the projection 240 is at least 1% to 20% thicker than the ledge 268.

Figure 2E:
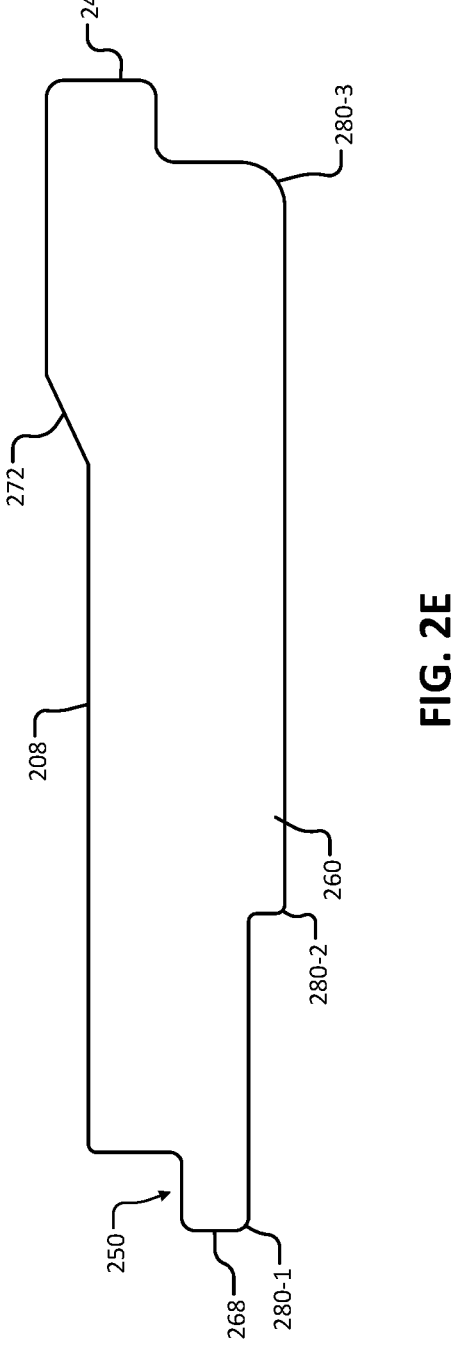
FIG. 2E is another example edge ring according to the present disclosure.

As shown in FIGS. 2A-2D and 2F, an upper surface of the wide-coverage edge ring 208 is generally flat. In other embodiments, the upper surface of the wide-coverage edge ring 208 may include an upward step (e.g., an angled or sloped upward step 270 as shown in FIG. 2E) or an upward slope (towards the outer diameter). In this manner, the thickness of the projection 240 can be increased without increasing a height or thickness at the inner diameter of the wide-coverage edge ring 208. In some embodiments, the wide-coverage edge ring 208 of FIG. 2E does not have the lower surface step 260 such that the bottom surface is generally flat like the bottom surface of the wide-coverage edge ring 208 depicted in FIGS. 2C and 2D. In some embodiments, the bottom surface of the wide-coverage edge ring 208 of FIG. 2E is modified to allow proper interfacing with the underlying components that do not form a pocket 252, as shown in FIG. 2A. In other words, in some embodiments, the bottom surface is configured to interface with a bottom ring that does not have rim 256 and a chamber liner 236 that does not does not include the outward step 244.

As shown in FIGS. 2A and 2B, the bottom ring 212 includes a plurality of guide channels 274. The guide channels 274 are aligned with the pocket 252 and the lower surface step 260. Lift pins 276 pass through respective ones of the guide channels 274 to interface with (i.e., contact) the bottom surface of the wide-coverage edge ring 208. Accordingly, the lift pins 276 can be raised and lowered to raise and lower the wide-coverage edge ring 208. For example, the lift pins 276 may raise the wide-coverage edge ring 208 to facilitate removal and replacement of the edge ring (e.g., using an end effector of a robot) and lower the wide-coverage edge ring 208 to lower the wide-coverage edge ring 208 onto the substrate support 204.

Although shown as generally flat, a region of the bottom surface of the wide-coverage edge ring 208 may be configured to facilitate contact with the lift pins 276. For example, the bottom surface of the wide-coverage edge ring 208 may include centering or retaining features (e.g., indentations or recesses) configured to align with the pins 276, a roughened surface region, etc. In other embodiments (e.g., as shown in FIG. 2C), the bottom ring 212 may not include the guide channels 274. In still other embodiments, the bottom ring 212 shown in FIG. 2C may include the guide channels 274 for receiving the lift pins 276 (e.g., as shown in FIG. 2D).

One more corners of the wide-coverage edge ring 208 may be curved or radiused to facilitate manufacture and engagement and/or alignment with the bottom ring 212, the ceramic layer 220, the chamber liner 236, etc. The corners may have same or different radiuses (i.e., radiuses of curvature). In the embodiments shown in FIGS. 2A and 2B, a first radius of a first lower, inner corner 280-1 may be different than a radius of a second lower, inner corner 280-2 of the wide-coverage edge ring 208. For example, the radius of the second, lower inner corner 280-2 may be at least two times greater than the first radius of the first lower, inner corner 280-1. In other examples, the first lower, inner corner 280-1 and the second lower, inner corner 280-2 have a same radius.

A lower, outer corner 280-3 has a second radius greater than the first radius. For example, the second radius is configured to be complementary to an inner surface of the chamber liner 236. In other words, the second radius of the lower, outer corner 280-3 is selected in accordance with a third radius defined by the outward step 244 of the chamber liner 236. In some embodiments, the second radius (i.e., radius of curvature) is at least two times greater than the first radius. In some embodiments, having a smaller first radius and a larger second radius facilitates alignment at the respective locations with the surrounding components. A radius of a corner 280-4 between the first lower, inner corner 280-1 and the second lower, inner corner 280-2 may be the same as the first radius of the first lower, inner corner 280-1.

In some embodiments, one or more surfaces of the wide-coverage edge ring 208 may be polished. For example, an upper surface of the wide-coverage edge ring 208 may be polished to increase optical transparency. Conversely, other surfaces of the wide-coverage edge ring 208 may be unpolished or intentionally roughened to reduce optical transparency. For example, the bottom surface of the wide-coverage edge ring 208 may be unpolished or roughened to facilitate detection during alignment in embodiments where a light beam is used to determine a position of the wide-coverage edge ring 208.

Figure 2F:
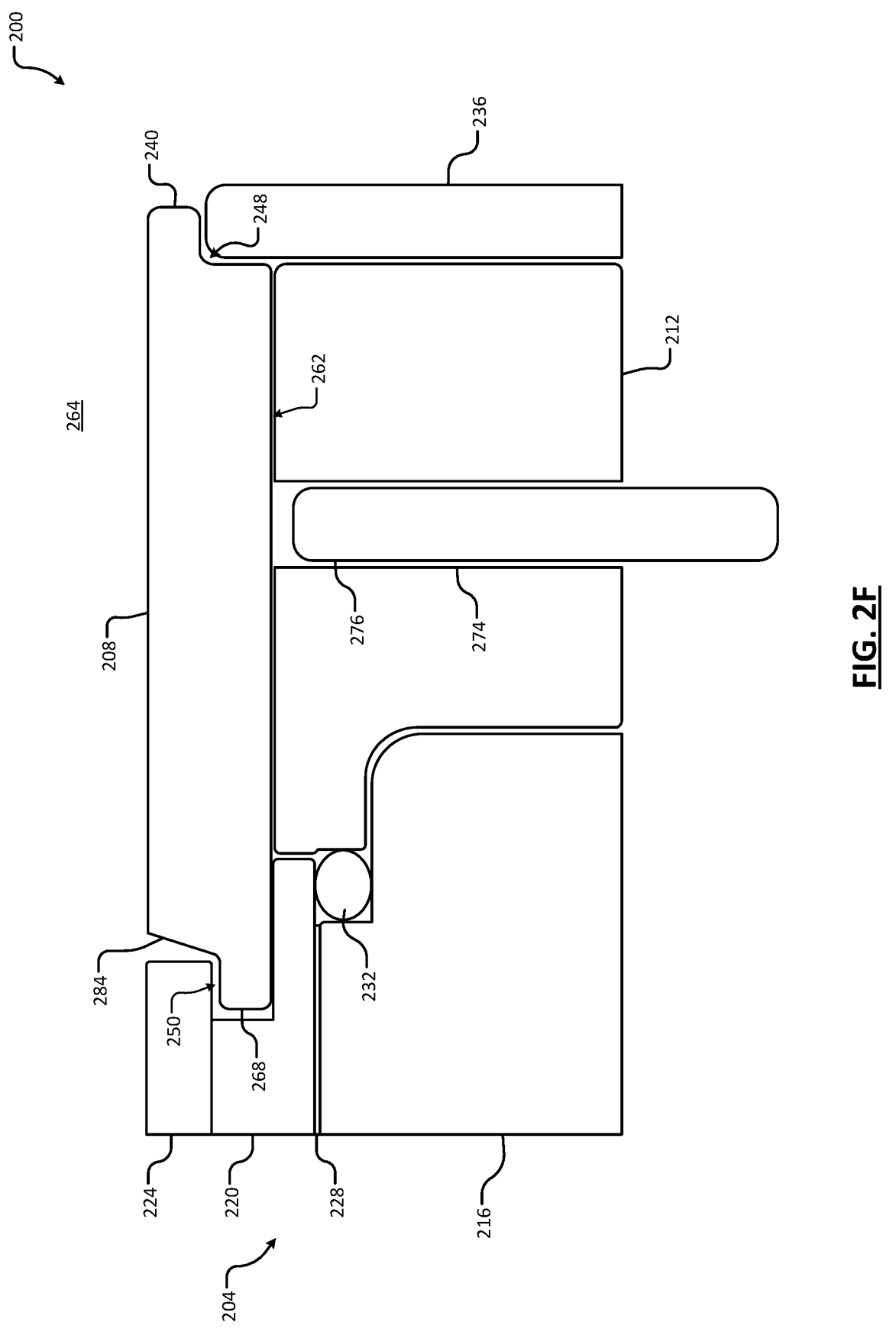
FIG. 2F is another example edge ring according to the present disclosure.

In some embodiments, an inner diameter of the wide-coverage edge ring 208 includes a sloped surface 284 as shown in FIG. 2F. For example, the sloped surface 284 has an angle of between 5 and 45 degrees relative to an upper surface of the step 250. In other examples, the angle may be less than 5 degrees or more than 45 degrees. As shown, the wide-coverage edge ring 208 in FIG. 2F is similar to the embodiment of the wide-coverage edge ring 208 shown in FIG. 2C but with an inner diameter that includes the sloped surface 284 instead of a substantially vertical surface. In other embodiments, any of the example wide-coverage edge rings 208 shown in FIGS. 2A-2E may include the sloped surface 284.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A wide-coverage edge ring configured to be arranged above a bottom ring in a substrate processing chamber, the wide-coverage edge ring comprising:
    an upper surface;
    a lower surface, wherein the lower surface of the edge ring includes a lower surface step extending downward from the lower surface, wherein the lower surface step is configured to be received within and interface with a pocket defined at least partially by an upper surface of the bottom ring and an inner surface of a chamber liner;
    an inner diameter, wherein a ledge is defined in the inner diameter of the edge ring; and
    an outer diameter, wherein the outer diameter of the edge ring includes a projection that extends radially outward from the edge ring and defines an inward step in the outer diameter, wherein the projection and the inward step are configured to interface with an upper end of the chamber liner, and wherein the projection is configured to extend at least partially over the upper end of the chamber liner.

2. The edge ring of claim 1, wherein the edge ring is a replaceable edge ring configured to be transferred into and out of the substrate processing chamber through a same opening as a substrate.

3. The edge ring of claim 1, wherein the edge ring is comprised of quartz.

4. The edge ring of claim 1, wherein the upper surface of the edge ring is generally flat.

5. The edge ring of claim 1, wherein the upper surface of the edge ring includes an angled upward step.

6. The edge ring of claim 1, wherein a lower, inner corner of the edge ring has a first radius and a lower, outer corner of the edge ring has a second radius.

7. The edge ring of claim 6, wherein the second radius is greater than the first radius.

8. The edge ring of claim 1, wherein a thickness of the projection is greater than or equal to a thickness of the ledge.

9. An edge ring system comprising the edge ring of claim 1 and further comprising the bottom ring.

10. The edge ring system of claim 9, wherein the bottom ring is comprised of ceramic.

11. The edge ring system of claim 10, wherein the bottom ring includes a plurality of guide channels.

12. The edge ring system of claim 10, wherein an inner diameter of the bottom ring includes a rim extending upward toward the edge ring, and wherein the pocket is defined between the rim and the chamber liner.

13. The edge ring system of claim 12, further comprising the chamber liner, wherein the upper end of the chamber liner includes an outward step, and wherein the pocket is defined between the rim and the outward step.

14. The edge ring system of claim 13, wherein a radius of a lower, outer corner of the edge ring is configured to interface with a radius defined by the outward step of the chamber liner.

15. The edge ring system of claim 13, wherein a serpentine path is defined between the edge ring and the chamber liner.

16. An edge ring system, comprising:
    a bottom ring, wherein a rim protrudes upward from an inner diameter of the bottom ring;
    a wide-coverage edge ring arranged on top of the bottom ring, the edge ring comprising
        an upper surface,
        a lower surface, wherein the lower surface of the edge ring includes a lower surface step extending downward from the lower surface radially outward of the rim, and wherein the lower surface step is configured to be received within and interface with a pocket defined at least partially by an upper surface of the bottom ring and an inner surface of a chamber liner,
        an inner diameter, wherein a ledge is defined in the inner diameter of the edge ring, and
        an outer diameter, wherein the outer diameter of the edge ring includes a projection that extends radially outward from the edge ring and defines an inward step in the outer diameter, wherein the projection and the inward step are configured to interface with an upper end of the chamber liner, and wherein the projection is configured to extend at least partially above the upper end of the chamber liner.

17. The edge ring system of claim 16, wherein the edge ring is comprised of quartz and the bottom ring is comprised of ceramic.

18. The edge ring system of claim 16, wherein a lower, inner corner of the edge ring has a first radius and a lower, outer corner of the edge ring has a second radius, and wherein the second radius is greater than the first radius.

19. The edge ring system of claim 18, further comprising the chamber liner, wherein the upper end of the chamber liner includes an outward step, wherein the pocket is defined between the rim and the outward step, and wherein the second radius of the lower, outer corner of the edge ring is configured to interface with a third radius defined by the outward step of the chamber liner.

20. The edge ring system of claim 19, wherein a serpentine path is defined between the edge ring and the chamber liner.

21. An edge ring system, comprising:

a bottom ring;

a wide-coverage edge ring arranged on top of the bottom ring, the edge ring comprising an upper surface, a lower surface, configured to be supported within and interface with a pocket defined at least partially by an upper surface of the bottom ring and an inner surface of a chamber liner, an inner diameter, wherein a ledge is defined in the inner diameter of the edge ring, and an outer diameter, wherein the outer diameter of the edge ring includes a projection that extends radially outward from the edge ring and defines an inward step in the outer diameter, wherein the projection and the inward step are configured to interface with an upper end of the chamber liner, and wherein the projection is configured to extend at least partially above the upper end of the chamber liner.

\* \* \* \* \*